United States Patent
Obu et al.

(10) Patent No.: US 9,130,004 B2
(45) Date of Patent: Sep. 8, 2015

(54) HETEROJUNCTION BIPOLAR TRANSISTOR, POWER AMPLIFIER INCLUDING THE SAME, AND METHOD FOR FABRICATING HETEROJUNCTION BIPOLAR TRANSISTOR

(71) Applicant: Murata Manufacturing Co., Ltd., Nagaokakyo-shi, Kyoto-fu (JP)

(72) Inventors: Isao Obu, Nagaokakyo (JP); Yasunari Umemoto, Nagaokakyo (JP); Atsushi Kurokawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/088,510

(22) Filed: Nov. 25, 2013

(65) Prior Publication Data

US 2014/0167115 A1    Jun. 19, 2014

(30) Foreign Application Priority Data

Dec. 18, 2012 (JP) ................................ 2012-275894

(51) Int. Cl.
| | | |
|---|---|---|
| *H01L 29/73* | (2006.01) | |
| *H01L 29/66* | (2006.01) | |
| *H01L 29/737* | (2006.01) | |
| *H01L 21/8252* | (2006.01) | |
| *H01L 27/06* | (2006.01) | |

(52) U.S. Cl.
CPC ........ *H01L 29/7304* (2013.01); *H01L 21/8252* (2013.01); *H01L 27/0605* (2013.01); *H01L 29/66242* (2013.01); *H01L 29/7371* (2013.01); *H01L 27/0658* (2013.01)

(58) Field of Classification Search
CPC ............ H01L 21/8252; H01L 27/0605; H01L 29/66242; H01L 29/7304; H01L 29/7371; H01L 2924/13051; H01L 29/6642
USPC .................. 257/197, 164, 580–582, E29.176
See application file for complete search history.

(56) References Cited

U.S. PATENT DOCUMENTS

| | | | |
|---|---|---|---|
| 5,389,554 A | 2/1995 | Liu et al. | |
| 6,043,520 A * | 3/2000 | Yamamoto et al. | ........... 257/198 |
| 2005/0156194 A1 | 7/2005 | Ohbu et al. | |

FOREIGN PATENT DOCUMENTS

| | | |
|---|---|---|
| EP | 0 778 622 A2 | 6/1997 |
| JP | 07-007013 A | 1/1995 |
| JP | 09-162194 A | 6/1997 |
| JP | 11-312689 A | 11/1999 |
| JP | 2005-236259 A | 9/2005 |

OTHER PUBLICATIONS

Official Communication issued in corresponding Taiwanese Patent Application No. 102139057, mailed on Apr. 13, 2015.

\* cited by examiner

*Primary Examiner* — Jose R Diaz
(74) *Attorney, Agent, or Firm* — Keating & Bennett, LLP

(57) ABSTRACT

A heterojunction bipolar transistor includes a ballast resistor layer of which resistance increases with an increase in temperature. The ballast resistor layer includes a first ballast resistor sub-layer having a positive temperature coefficient of resistivity in a first temperature range and a second temperature range and a second ballast resistor sub-layer having a negative temperature coefficient of resistivity in the first temperature range and a positive temperature coefficient of resistivity in the second temperature range.

15 Claims, 20 Drawing Sheets

US 9,130,004 B2

HETEROJUNCTION BIPOLAR TRANSISTOR, POWER AMPLIFIER INCLUDING THE SAME, AND METHOD FOR FABRICATING HETEROJUNCTION BIPOLAR TRANSISTOR

BACKGROUND OF THE INVENTION

1. Field of the Invention

The present invention relates to a heterojunction bipolar transistor, a power amplifier including the same, and a method for fabricating a heterojunction bipolar transistor.

2. Description of the Related Art

Japanese Unexamined Patent Application Publication No. 2005-236259 discloses a heterojunction bipolar transistor (hereinafter referred to as an HBT in some cases) including an n-type InGaP emitter layer, an AlGaAs emitter ballast resistor layer, and a GaAs layer interposed therebetween. The AlGaAs emitter ballast resistor layer is formed by metalorganic vapor phase epitaxy and has an Al-to-As molar ratio of about 0.33, an Si concentration of about $1 \times 10^{17}$ cm$^{-3}$, and a film thickness of about 120 nm.

In general, a power amplifier uses a large amount of electricity and therefore includes a large number of HBTs (hereinafter referred to as unit HBTs), connected in parallel, having a small emitter size.

However, the following case occurs: the case where all unit HBTs connected in parallel do not operate uniformly because of unevenness due to a HBT-fabricating process or the like. In this case, currents may possibly concentrate on specifics of the unit HBTs to cause thermal runaway, leading to element breakdown.

In order to prevent the thermal runaway, a ballast resistor is generally provided in an emitter or a base for each unit HBT.

A technique disclosed in Japanese Unexamined Patent Application Publication No. 2005-236259 is described herein in association with a mechanism for preventing thermal runaway by an AlGaAs emitter ballast resistor layer. The temperature dependence of resistivity of the AlGaAs emitter ballast resistor layer is as illustrated in FIG. 20. When a unit HBT begins to thermally run away, the temperature thereof increases due to current concentration. The emitter ballast resistance of the unit HBT beginning to thermally run away increases sharply with the increase in temperature thereof (for example, at about 100° C. or higher as illustrated in FIG. 20). The sharp increase in emitter ballast resistance thereof suppresses the emitter-base voltage of the unit HBT beginning to thermally run away and therefore suppresses the concentration of currents on the unit HBT beginning to thermally run away, thereby avoiding thermal runaway.

On the other hand, a power amplifier needs to keep power amplifier (power amplifying) characteristics not only at room temperature but also at elevated temperatures (for example, about 85° C. to 100° C.) as a whole. However, other unit HBTs that are not in thermal runaway are each equipped with an emitter ballast resistor. As is clear from FIG. 20, the emitter ballast resistance of an HBT increases by about 13% or about 21% at, for example, about 85° C. or about 100° C., respectively, as compared to the emitter ballast resistance at room temperature, that is, the parasitic resistance thereof increases.

Therefore, in the case of fabricating a power amplifier by the technique disclosed in Japanese Unexamined Patent Application Publication No. 2005-236259, the thermal runaway of HBTs can be prevented. However, there is a problem in that the increase in emitter ballast resistance due to an increase in temperature deteriorates power amplifier characteristics at elevated temperatures.

SUMMARY OF THE INVENTION

In view of the above circumstances, preferred embodiments of the present invention provide a heterojunction bipolar transistor that prevents both thermal runaway and the deterioration of power amplifier characteristics at elevated temperatures.

A heterojunction bipolar transistor according to a preferred embodiment of the present invention includes a ballast resistor layer of which the resistance increases with an increase in temperature. The ballast resistor layer includes a first ballast resistor sub-layer having a positive temperature coefficient of resistivity in a first temperature range and a second temperature range and a second ballast resistor sub-layer having a negative temperature coefficient of resistivity in the first temperature range and a positive temperature coefficient of resistivity in the second temperature range.

A method for fabricating a heterojunction bipolar transistor including a ballast resistor layer of which the resistance increases with an increase in temperature includes a step of forming the ballast resistor layer. The ballast resistor layer-forming step includes a sub-step of forming a first ballast resistor sub-layer having a positive temperature coefficient of resistivity in a first temperature range and a second temperature range and a sub-step of forming a second ballast resistor sub-layer having a negative temperature coefficient of resistivity in the first temperature range and a positive temperature coefficient of resistivity in the second temperature range.

According to various preferred embodiments of the present invention, power amplifier characteristics are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
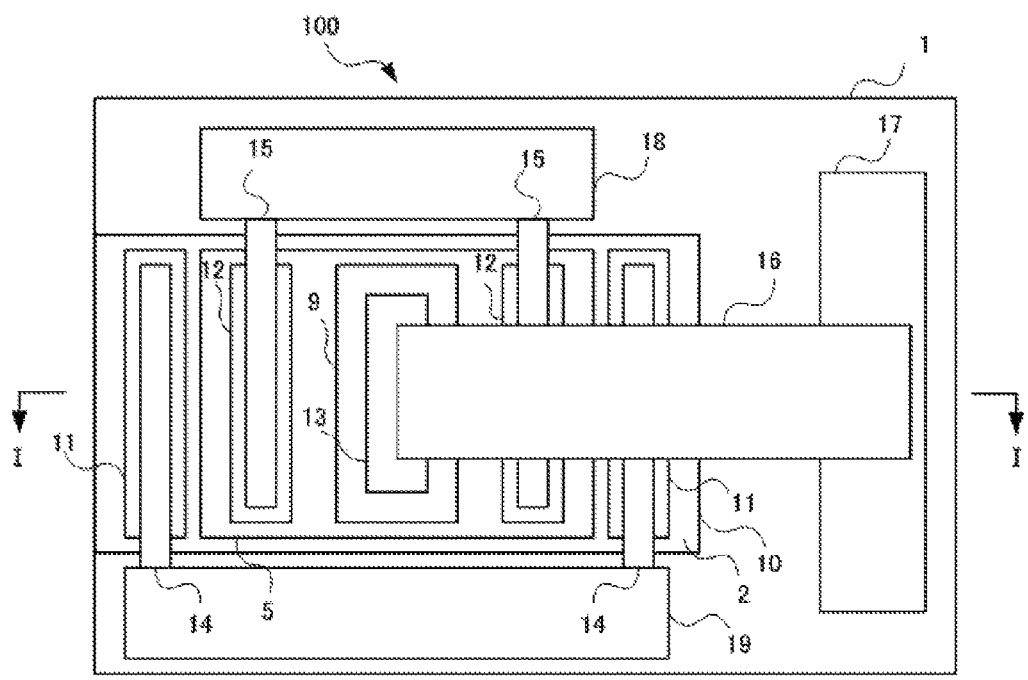
FIG. 1 is a plan view of an HBT according to a first preferred embodiment of the present invention.
Figure 2:
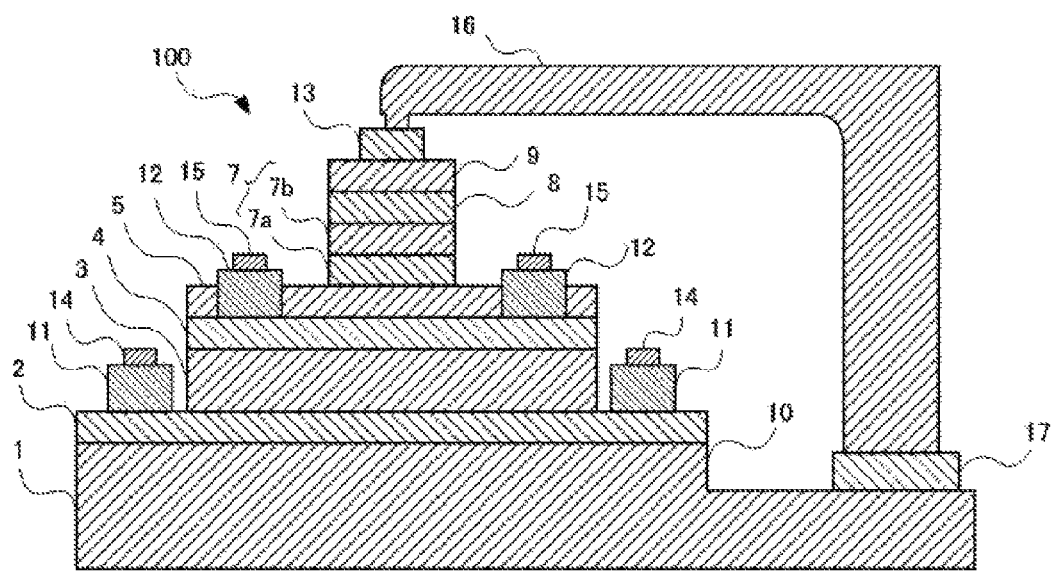
FIG. 2 is a sectional view taken along the line I-I of FIG. 1.

FIG. 1 is a plan view of an HBT 100 (a rectangular or substantially rectangular emitter with a size of about 3 μm×about 20 μm, for example) according to a first preferred embodiment of the present invention. FIG. 2 is a sectional view taken along the line I-I of FIG. 1. As illustrated in FIGS. 1 and 2, an n-type GaAs sub-collector layer 2 having a Si concentration of about $5×10^{18}$ cm$^{-3}$ and a film thickness of about 0.6 μm is placed on a semi-insulating GaAs substrate 1. The following layers are arranged on the n-type GaAs sub-collector layer 2 in this order: an n-type GaAs collector layer 3 having a Si concentration of about $1×10^{16}$ cm$^{-3}$ and a film thickness of about 1.0 μm; a p-type GaAs base layer 4 having a C concentration of about $4×10^{19}$ cm$^{-3}$ and a film thickness of about 150 nm; and an n-type InGaP emitter layer 5 having an In-to-P molar ratio of 0.5, a Si concentration of about $3×10^{17}$ cm$^{-3}$, and a film thickness of about 30 nm. Base electrodes 12 are arranged in the n-type InGaP emitter layer 5.

Furthermore, the following layers are arranged on the n-type InGaP emitter layer 5 in this order: an n-type AlGaAs emitter ballast resistor sub-layer 7a which is a first ballast resistor sub-layer and which has an Al-to-As molar ratio of about 0.33, a Si concentration of about $5.4×10^{16}$ cm$^{-3}$, and a film thickness of about 37 nm; an n-type AlGaAs emitter ballast resistor sub-layer 7b which is a second ballast resistor sub-layer and which has an Al-to-As molar ratio of about 0.33, a Si concentration of about $5.0×10^{17}$ cm$^{-3}$, and a film thickness of about 122 nm; an n-type GaAs contact layer 8 having a Si concentration of about $1×10^{19}$ cm$^{-3}$ and a film thickness of about 50 nm; and an n-type InGaAs contact layer 9 having an In-to-As molar ratio of about 0.5, a Si concentration of about $1×10^{19}$ cm$^{-3}$, and a film thickness of about 50 nm. The n-type AlGaAs emitter ballast resistor sub-layers 7a and 7b define a ballast resistor layer 7.

The n-type InGaAs contact layer 9 is overlaid with an emitter electrode 13. The n-type GaAs sub-collector layer 2 is overlaid with collector electrodes 11. The collector electrodes 11, the base electrodes 12, and the emitter electrode 13 are exemplified below in detail. The collector electrodes 11 are defined by stacking an Au—Ge layer with a film thickness of about 60 nm, a Ni layer with a film thickness of about 10 nm, and an Au layer with a film thickness of about 200 nm. The base electrodes 12 are defined by stacking a Ti layer with a film thickness of about 50 nm, a Pt layer with a film thickness of about 50 nm, and an Au layer with a film thickness of about 200 nm. The emitter electrode 13 is made of W—Si and has a W-to-Si molar ratio of about 0.3 and a film thickness of about 0.3 μm.

The collector electrodes 11 are connected to a metal pad 19 through collector lines 14. The base electrodes 12 are connected to a metal pad 18 through base lines 15. The emitter electrode 13 is connected to a metal pad 17 through an emitter line 16. The metal pads 17 to 19 are used for the electrical connection of the HBT 100 to the outside.

Figure 3:
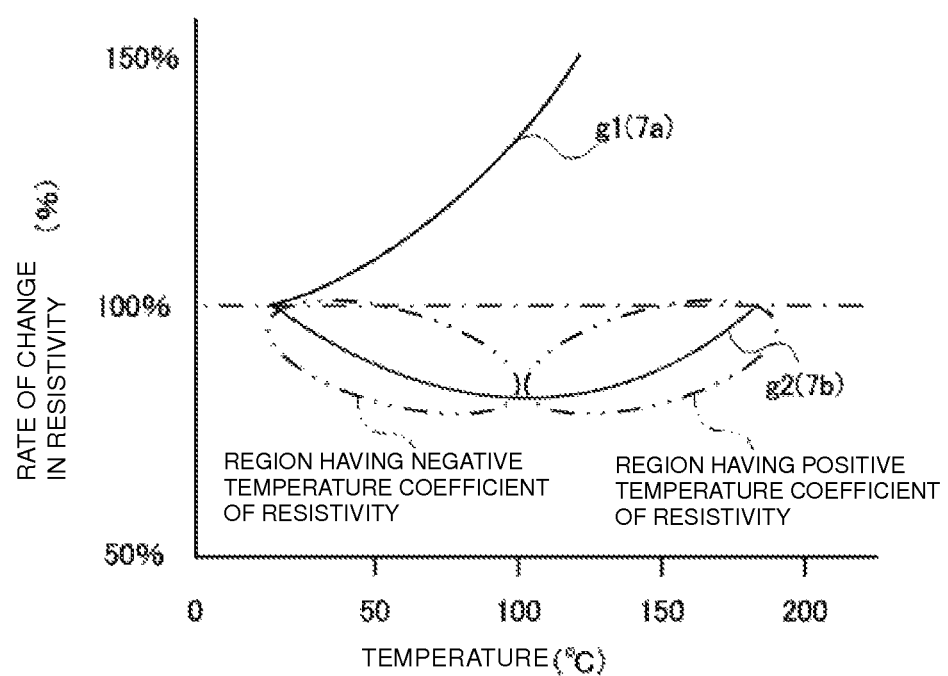
FIG. 3 is a graph illustrating the temperature dependence of resistivity of a ballast resistor layer used in the first preferred embodiment of the present invention.

FIG. 3 illustrates the temperature dependence of resistivity, g1, of the n-type AlGaAs emitter ballast resistor sub-layer 7a and the temperature dependence of resistivity, g2, of the n-type AlGaAs emitter ballast resistor sub-layer 7b. In FIG. 3, the rate of change in resistivity with temperature is illustrated on the basis of the resistivity (100%) at room temperature.

As illustrated in FIG. 3, the n-type AlGaAs emitter ballast resistor sub-layer 7a consistently has a positive temperature coefficient of resistivity in a temperature range (first temperature range) from room temperature to about 100° C. and in a temperature range (second temperature range) of not lower than about 100° C. (g1 in FIG. 3). The resistivity of the n-type AlGaAs emitter ballast resistor sub-layer 7a increases with an increase in temperature.

In contrast, in a temperature range (first temperature range) from room temperature to about 100° C., the resistivity of the n-type AlGaAs emitter ballast resistor sub-layer 7b decreases, that is, the n-type AlGaAs emitter ballast resistor sub-layer 7b has a negative temperature coefficient of resistivity. In a temperature range (second temperature range) of not lower than about 100° C., the resistivity of the n-type AlGaAs emitter ballast resistor sub-layer 7b increases, that is, the n-type AlGaAs emitter ballast resistor sub-layer 7b has a positive temperature coefficient of resistivity (g2 in FIG. 3).

Figure 4:
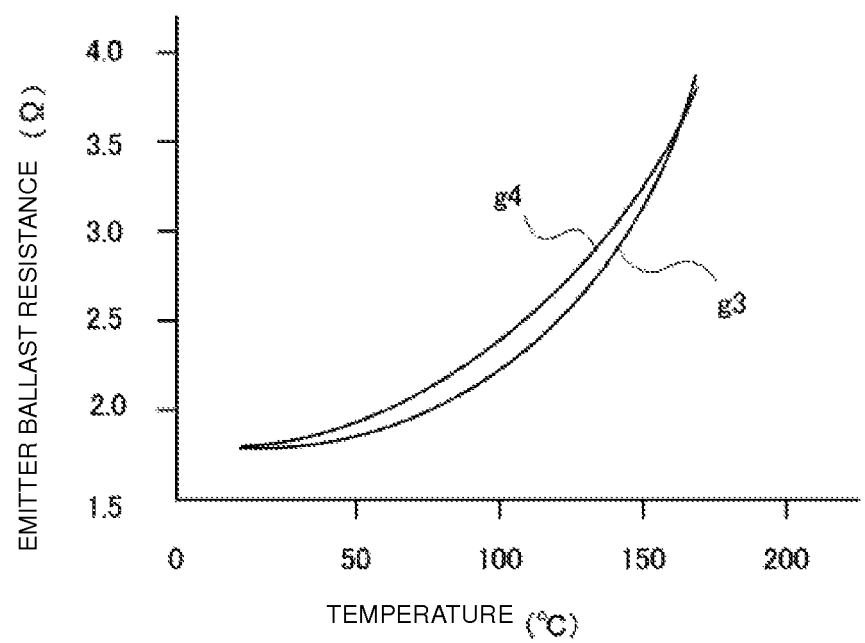
FIG. 4 is a graph illustrating the relationship between the emitter ballast resistance and temperature of the HBT according to the first preferred embodiment of the present invention.

FIG. 4 illustrates the temperature dependence of emitter ballast resistance, g3, of the HBT 100. FIG. 4 also illustrates the temperature dependence of emitter ballast resistance, g4, of an HBT including an n-type AlGaAs emitter ballast resistor layer according to a known technique disclosed in Patent Document 1. The n-type AlGaAs emitter ballast resistor layer has an Al-to-As molar ratio of about 0.33, a Si concentration of about $1.0×10^{17}$ cm$^{-3}$, and a film thickness of about 120 nm.

As is clear from FIG. 4, the emitter ballast resistance of the HBT 100 is improved in flatness in a temperature range from room temperature to about 100° C. as compared to the HBT according to the known technique.

In particular, the increase in emitter ballast resistance of the HBT according to the known technique is +13% at 85° C. and is +21% at 100° C. on the basis of the emitter ballast resistance at room temperature. In contrast, the increase in emitter ballast resistance of the HBT 100 is +4% at 85° C. and is +9% at 100° C., that is, the increase in emitter ballast resistance of the HBT 100 is significantly improved. In addition, the emitter ballast resistance of the HBT 100 increases more sharply in a temperature range of not lower than 100° C. as compared to the emitter ballast resistance of the HBT according to the known technique.

Thus, the HBT 100 according to the first preferred embodiment prevents both thermal runaway and the deterioration of power amplifier characteristics at elevated temperatures because the ballast resistor layer 7 varies in resistance with an increase in temperature and includes the n-type AlGaAs emitter ballast resistor sub-layer 7a and the n-type AlGaAs emitter ballast resistor sub-layer 7b, the n-type AlGaAs emitter ballast resistor sub-layer 7a has a positive temperature coefficient of resistivity in a temperature range from room temperature to about 100° C. and in a temperature range of not lower than about 100° C., and the n-type AlGaAs emitter ballast resistor sub-layer 7b has a negative temperature coefficient of resistivity in a temperature range from room temperature to about 100° C. and a positive temperature coefficient of resistivity in a temperature range of not lower than about 100° C.

In the first preferred embodiment, the n-type AlGaAs emitter ballast resistor sub-layer 7b, which has an Al-to-As molar ratio of about 0.33, preferably has a Si concentration of about $5.0 \times 10^{17}$ cm$^{-3}$. When the n-type AlGaAs emitter ballast resistor sub-layer 7b has a Si concentration of about $1.4 \times 10^{17}$ cm$^{-3}$ or more, the n-type AlGaAs emitter ballast resistor sub-layer 7b can provide substantially the same effect as above.

Second Preferred Embodiment

A second preferred embodiment of the present invention will now be described. The second preferred embodiment is different from the first preferred embodiment in that the configuration of a ballast resistor layer 7 is varied. The same components as those described in the first preferred embodiment are designated by the same reference numerals as those used in the first preferred embodiment and will not be described in detail.

Figure 5:
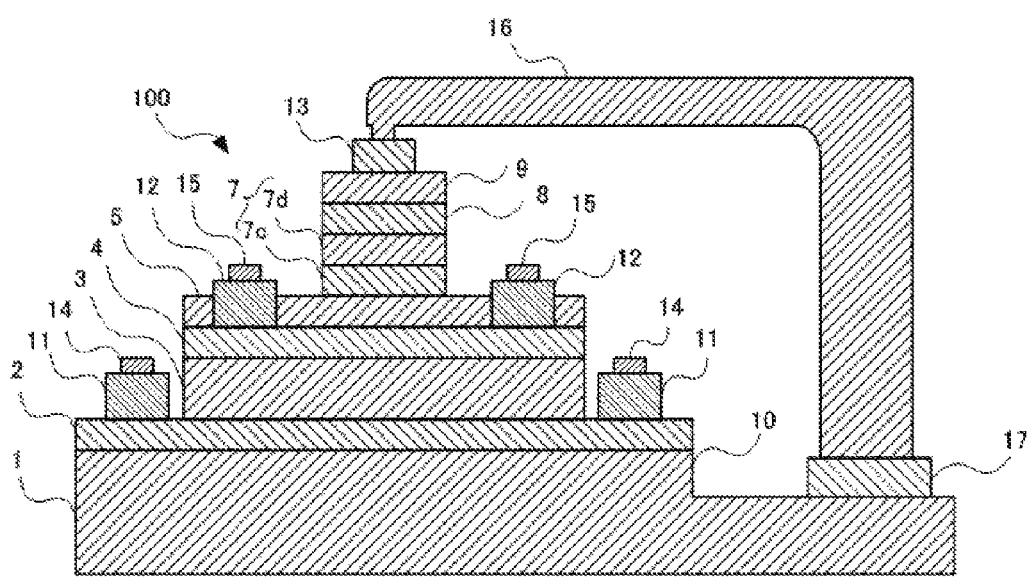
FIG. 5 is a sectional view of an HBT according to a second preferred embodiment of the present invention.

FIG. 5 is a sectional view of an HBT 100, according to the second preferred embodiment, taken along the line I-I. FIG. 5 is different from FIG. 2 in the configuration of the ballast resistor layer 7. In particular, in the second preferred embodiment, the ballast resistor layer 7 includes an n-type AlGaAs emitter ballast resistor sub-layer 7c which is a first ballast resistor sub-layer and which has an Al-to-As molar ratio of about 0.33, a Si concentration of about $5.4 \times 10^{16}$ cm$^{-3}$, and a film thickness of about 26 nm and an n-type AlGaAs emitter ballast resistor sub-layer 7d which is a second ballast resistor sub-layer and which has an Al-to-As molar ratio of about 0.28, a Si concentration of about $5.0 \times 10^{17}$ cm$^{-3}$, and a film thickness of about 398 nm instead of the n-type AlGaAs emitter ballast resistor sub-layer 7a and n-type AlGaAs emitter ballast resistor sub-layer 7b illustrated in FIG. 2.

Figure 6:
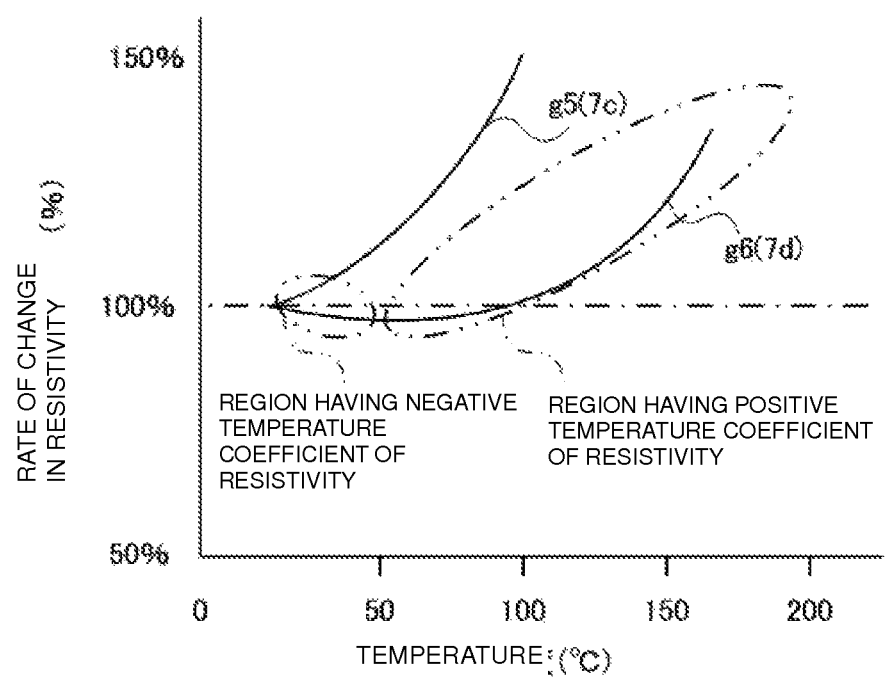
FIG. 6 is a graph illustrating the temperature dependence of resistivity of a ballast resistor layer used in the second preferred embodiment of the present invention.

FIG. 6 illustrates the temperature dependence of resistivity, g5, of the n-type AlGaAs emitter ballast resistor sub-layer 7c and the temperature dependence of resistivity, g6, of the n-type AlGaAs emitter ballast resistor sub-layer 7d. In FIG. 6, as well as FIG. 3, the rate of change in resistivity with temperature is illustrated on the basis of the resistivity (100%) at room temperature.

As illustrated in FIG. 6, the n-type AlGaAs emitter ballast resistor sub-layer 7c consistently has a positive temperature coefficient of resistivity in a temperature range (first temperature range) from room temperature to about 50° C. and in a temperature range (second temperature range) of not lower than about 50° C. (g5 in FIG. 6). The resistivity of the n-type AlGaAs emitter ballast resistor sub-layer 7c increases with an increase in temperature.

In contrast, in a temperature range (first temperature range) from room temperature to about 50° C., the resistivity of the n-type AlGaAs emitter ballast resistor sub-layer 7d decreases, that is, the n-type AlGaAs emitter ballast resistor sub-layer 7d has a negative temperature coefficient of resistivity. In a temperature range (second temperature range) of not lower than about 50° C., the resistivity of the n-type AlGaAs emitter ballast resistor sub-layer 7d increases, that is, the n-type AlGaAs emitter ballast resistor sub-layer 7d has a positive temperature coefficient of resistivity (g6 in FIG. 6).

Figure 7:
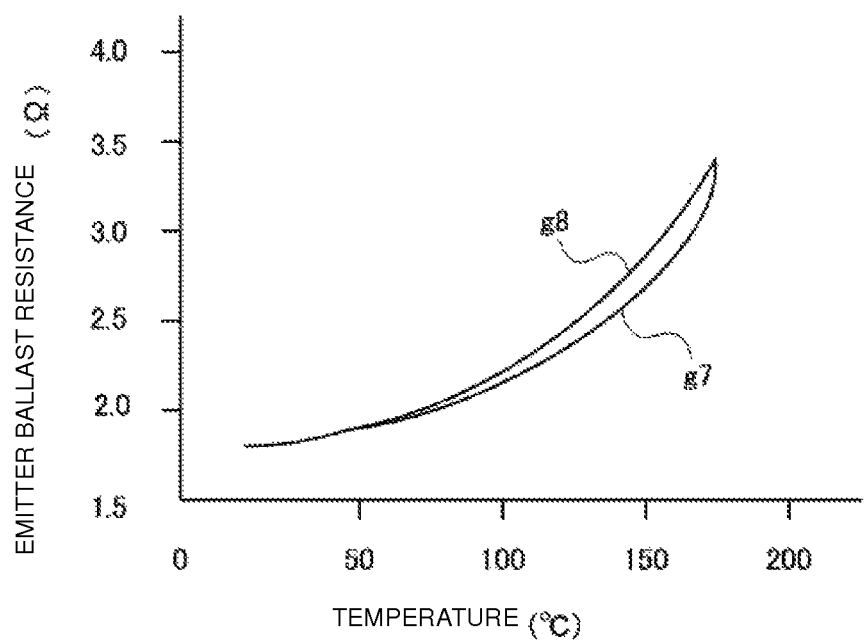
FIG. 7 is a graph illustrating the relationship between the emitter ballast resistance and temperature of the HBT according to the second preferred embodiment of the present invention.

FIG. 7 illustrates the temperature dependence of emitter ballast resistance, g7, of the HBT 100. FIG. 7 also illustrates the temperature dependence of emitter ballast resistance, g8, of an HBT including an n-type AlGaAs emitter ballast resistor layer according to a known technique disclosed in Japanese Patent No. 4977313. The n-type AlGaAs emitter ballast resistor layer has an Al-to-As molar ratio of about 0.33, a Si concentration of about $1.0 \times 10^{17}$ cm$^{-3}$, and a film thickness of about 120 nm.

As is clear from FIG. 7, the emitter ballast resistance of the HBT 100 is improved in flatness in a temperature range from room temperature to about 100° C. as compared to the HBT according to the known technique.

In particular, the increase in emitter ballast resistance of the HBT according to the known technique is +13% at 85° C. and is +21% at 100° C. on the basis of the emitter ballast resistance at room temperature. In contrast, the increase in emitter ballast resistance of the HBT 100 is +11% at 85° C. and is +17% at 100° C., that is, the increase in emitter ballast resistance of the HBT 100 is significantly improved. In addition, the emitter ballast resistance of the HBT 100 increases more sharply in a temperature range of not lower than about 100° C. as compared to the emitter ballast resistance of the HBT according to the known technique.

The HBT 100 according to the second preferred embodiment prevents both thermal runaway and the deterioration of power amplifier characteristics at elevated temperatures because the ballast resistor layer 7 varies in resistance with an increase in temperature and includes the n-type AlGaAs emitter ballast resistor sub-layer 7c and the n-type AlGaAs emitter ballast resistor sub-layer 7d, the n-type AlGaAs emitter ballast resistor sub-layer 7c has a positive temperature coefficient of resistivity in a temperature range from room temperature to about 50° C. and in a temperature range of not lower than about 50° C., and the n-type AlGaAs emitter ballast resistor sub-layer 7d has a negative temperature coefficient of resistivity in a temperature range from room temperature to about 50° C. and a positive temperature coefficient of resistivity in a temperature range of not lower than about 50° C.

In the second preferred embodiment, the n-type AlGaAs emitter ballast resistor sub-layer 7d, which has an Al-to-As molar ratio of about 0.28, has a Si concentration of about $5.0 \times 10^{17}$ cm$^{-3}$. When the n-type AlGaAs emitter ballast resistor sub-layer 7d has a Si concentration of about $4.9 \times 10^{17}$ cm$^{-3}$ or more, the n-type AlGaAs emitter ballast resistor sub-layer 7d provides substantially the same effect as above.

In the ballast resistor layers 7 used in the first and second preferred embodiments, the n-type AlGaAs emitter ballast resistor sub-layer 7a or the n-type AlGaAs emitter ballast resistor sub-layer 7c preferably is placed close to the n-type InGaP emitter layer 5 (above the n-type InGaP emitter layer 5 in each preferred embodiment). This enables the effect of preventing thermal runaway to be more enhanced as compared to the case where the n-type AlGaAs emitter ballast resistor sub-layer 7b or the n-type AlGaAs emitter ballast resistor sub-layer 7d is placed close to the n-type InGaP emitter layer 5, because the n-type AlGaAs emitter ballast resistor sub-layer 7a and the n-type AlGaAs emitter ballast resistor sub-layer 7c consistently have a positive temperature coefficient of resistivity at room temperature or higher (g1 in FIG. 3 and g5 in FIG. 6).

Third Preferred Embodiment

A third preferred embodiment of the present invention will now be described. The third preferred embodiment is different from the first preferred embodiment in that the configuration of a ballast resistor layer 7 is varied. The same components as those described in the first preferred embodiment are designated by the same reference numerals as those used in the first preferred embodiment and will not be described in detail.

Figure 8:
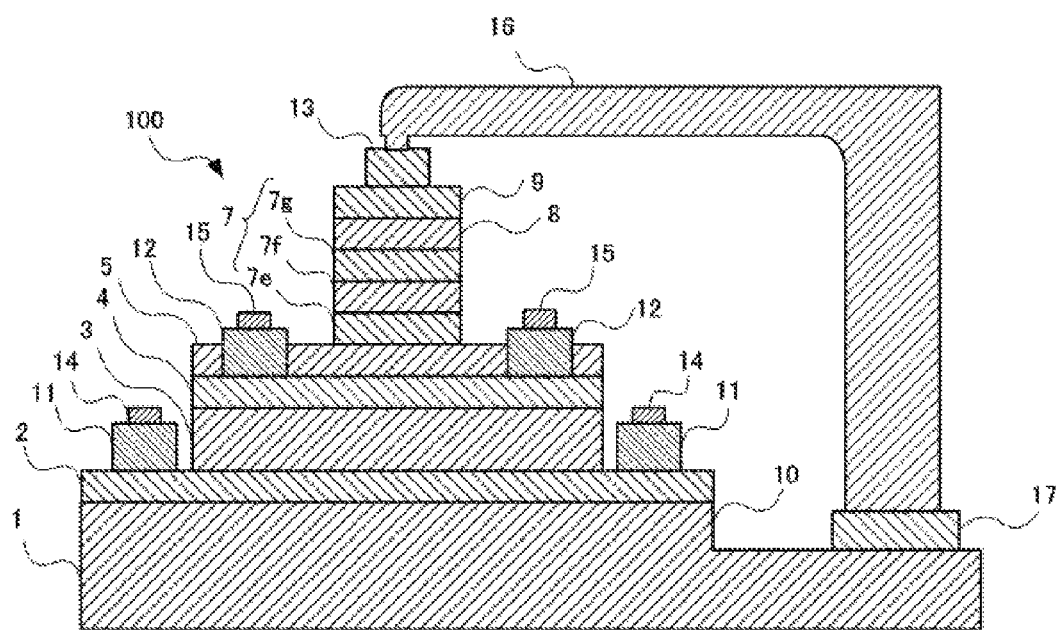
FIG. 8 is a sectional view of an HBT according to a third preferred embodiment of the present invention.

FIG. 8 is a sectional view of an HBT 100, according to the third preferred embodiment, taken along the line I-I. FIG. 8 is different from FIG. 2 in that the configuration of a ballast resistor layer 7. In particular, in the third preferred embodiment, the ballast resistor layer 7 preferably includes three sub-layers: an n-type AlGaAs emitter ballast resistor sub-layer 7e which is a third ballast resistor sub-layer and which has an Al-to-As molar ratio of about 0.33, a Si concentration of about $5.0 \times 10^{17}$ cm$^{-3}$, and a film thickness of about 61 nm; an n-type AlGaAs emitter ballast resistor sub-layer 7f which is a first ballast resistor sub-layer and which has an Al-to-As molar ratio of about 0.33, a Si concentration of about $5.4 \times 10^{16}$ cm$^{-3}$, and a film thickness of about 37 nm; and an n-type AlGaAs emitter ballast resistor sub-layer 7g which is a second ballast resistor sub-layer and which has an Al-to-As molar ratio of about 0.33, a Si concentration of about $5.0 \times 10^{17}$ cm$^{-3}$, and a film thickness of about 61 nm, these sub-layers being arranged on an n-type InGaP emitter layer 5 in that order.

The n-type AlGaAs emitter ballast resistor sub-layer 7f is substantially the same in material and thickness as the n-type AlGaAs emitter ballast resistor sub-layer 7a described in the first preferred embodiment. The n-type AlGaAs emitter ballast resistor sub-layers 7e and 7g are substantially the same in material as the n-type AlGaAs emitter ballast resistor sub-layer 7b described in the first preferred embodiment and are half the thickness thereof. Thus, the temperature dependence of resistivity of a combination of the n-type AlGaAs emitter ballast resistor sub-layers 7e and 7g is not substantially different from the temperature dependence of resistivity (g2 in FIG. 3) of the n-type AlGaAs emitter ballast resistor sub-layer 7b described in the first preferred embodiment.

The HBT 100 according to the third preferred embodiment prevents both thermal runaway and the deterioration of power amplifier characteristics at elevated temperatures because the ballast resistor layer 7 varies in resistance with an increase in temperature, the n-type AlGaAs emitter ballast resistor sub-layer 7f has a positive temperature coefficient of resistivity in a temperature range from room temperature to about 100° C. and in a temperature range of not lower than about 100° C., the n-type AlGaAs emitter ballast resistor sub-layers 7e and 7g have a negative temperature coefficient of resistivity in a temperature range from room temperature to about 100° C. and a positive temperature coefficient of resistivity in a temperature range of not lower than about 100° C., and the n-type AlGaAs emitter ballast resistor sub-layer 7f is sandwiched between the n-type AlGaAs emitter ballast resistor sub-layers 7e and 7g.

In the third preferred embodiment, the n-type AlGaAs emitter ballast resistor sub-layers 7e and 7g, which have an Al-to-As molar ratio of about 0.33, have a Si concentration of about $5.0 \times 10^{17}$ cm$^{-3}$. When the n-type AlGaAs emitter ballast resistor sub-layers 7e and 7g have a Si concentration of about $1.4 \times 10^{17}$ cm$^{-3}$ or more, the n-type AlGaAs emitter ballast resistor sub-layers 7e and 7g provide substantially the same effect as above.

In the first to third preferred embodiments, the case of using InGaP for the n-type InGaP emitter layer 5 is described. The present invention is not limited to this case. Even in an HBT including an n-type AlGaAs emitter layer instead of the n-type InGaP emitter layer 5, substantially the same effect as that of the HBT 100 is achieved.

The case where the dopant concentration of each of the n-type AlGaAs emitter ballast resistor sub-layers 7a to 7g in the ballast resistor layers 7 preferably is constant is described above. The present invention is not limited to this case. The dopant concentration thereof may be graded in a thickness direction of the n-type AlGaAs emitter ballast resistor sub-layer 7a or 7b.

Fourth Preferred Embodiment

A fourth preferred embodiment of the present invention will now be described. The fourth preferred embodiment is different from the first to third preferred embodiments in that an n-type GaAs layer 6 is interposed between an n-type InGaP emitter layer 5 and a ballast resistor layer 7. The same components as those described in the first preferred embodiment are designated by the same reference numerals as those used in the first preferred embodiment and will not be described in detail.

Figure 9:
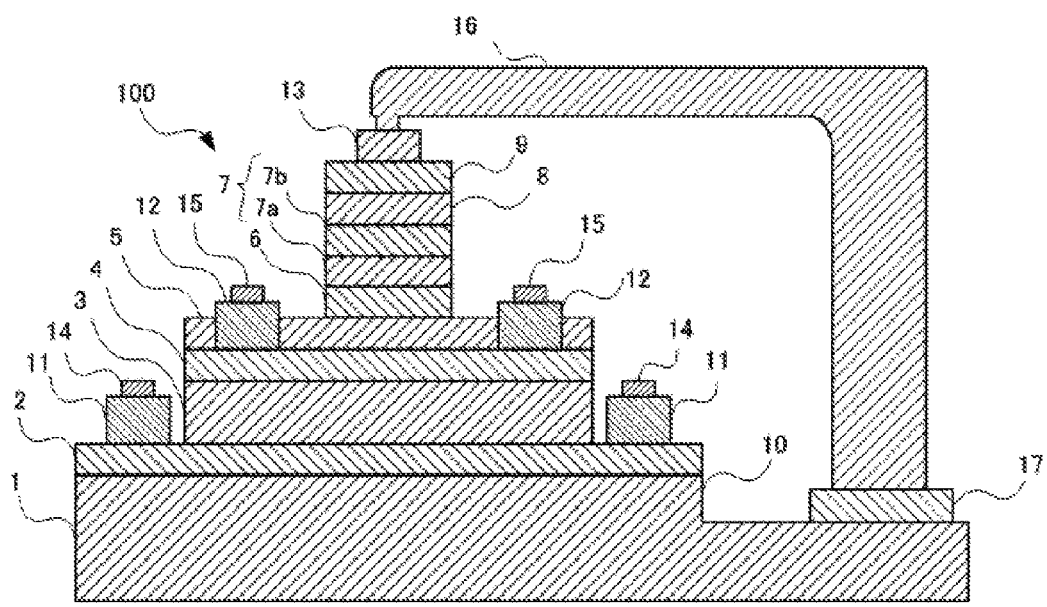
FIG. 9 is a sectional view of an HBT according to a fourth preferred embodiment of the present invention.
Figure 10:
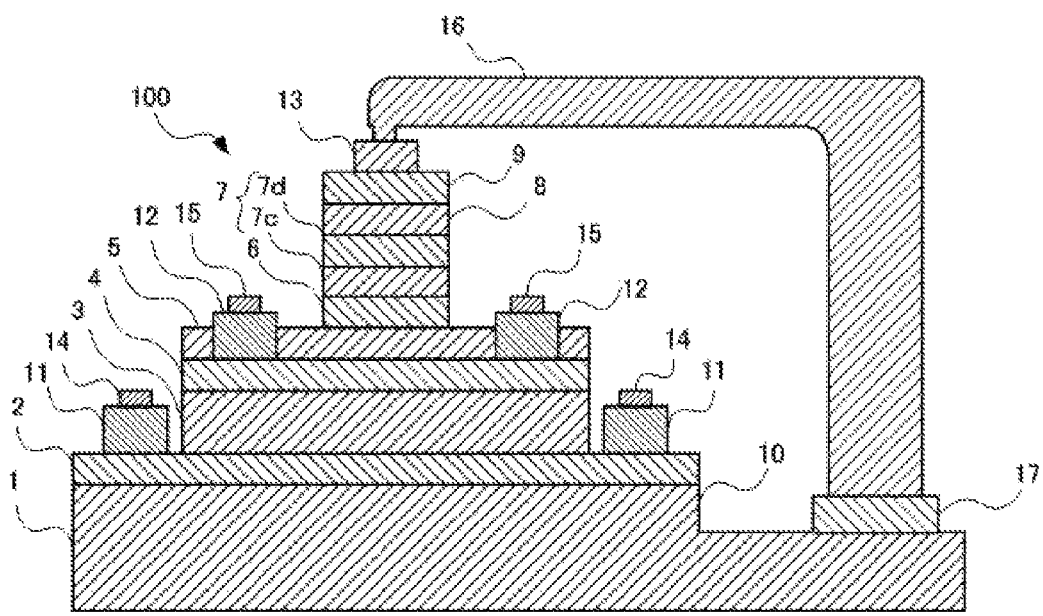
FIG. 10 is a sectional view of the HBT according to the fourth preferred embodiment of the present invention.
Figure 11:
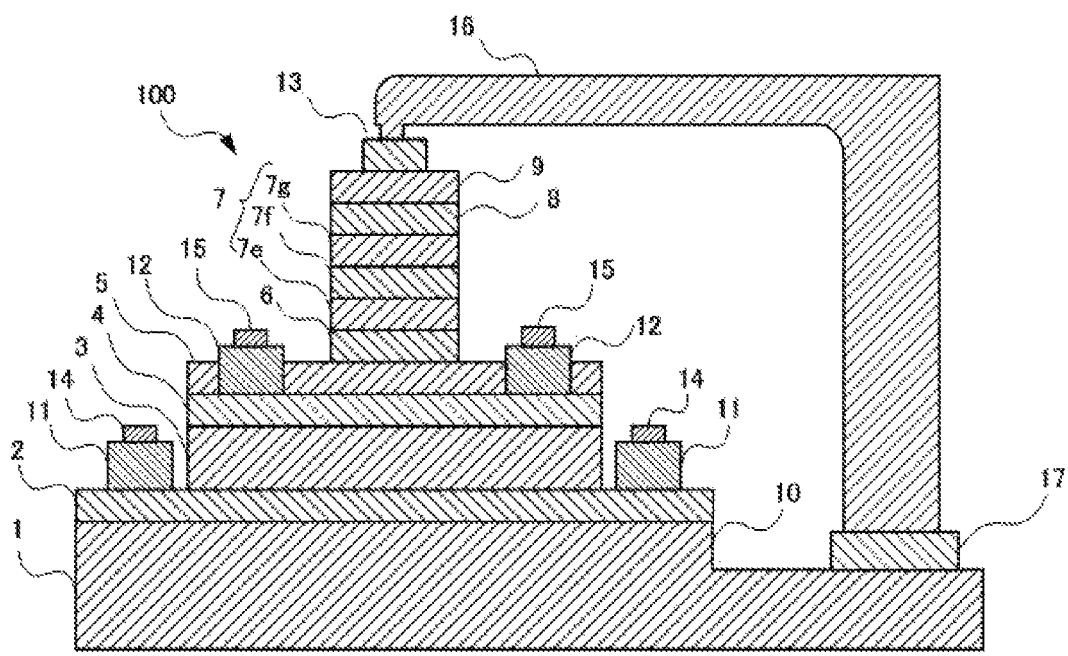
FIG. 11 is a sectional view of the HBT according to the fourth preferred embodiment of the present invention.

FIGS. 9 to 11 are sectional views of an HBT 100 according to the fourth preferred embodiment. In the HBT 100, the n-type GaAs layer 6 is interposed between the n-type InGaP emitter layer 5 and the ballast resistor layer 7 and has a Si concentration of about $3 \times 10^{17}$ cm$^{-3}$ and a film thickness of about 90 nm.

In the HBT 100 according to the fourth preferred embodiment, in addition to achieving substantially the same effects as those described in the first to third preferred embodiments, the n-type GaAs layer 6, which is interposed between the n-type InGaP emitter layer 5 and the ballast resistor layer 7, prevents holes reversely injected from a p-type GaAs base layer 4 diffuse from reaching the ballast resistor layer 7. This allows the HBT 100 to have increased reliability.

Fifth Preferred Embodiment

A fifth preferred embodiment of the present invention will now be described. The fifth preferred embodiment is different from the first preferred embodiment in that HBTs (unit HBTs) which are substantially the same as that according to the first preferred embodiment are connected in parallel. The same components as those described in the first preferred embodiment are designated by the same reference numerals as those used in the first preferred embodiment and will not be described in detail.

Figure 12:
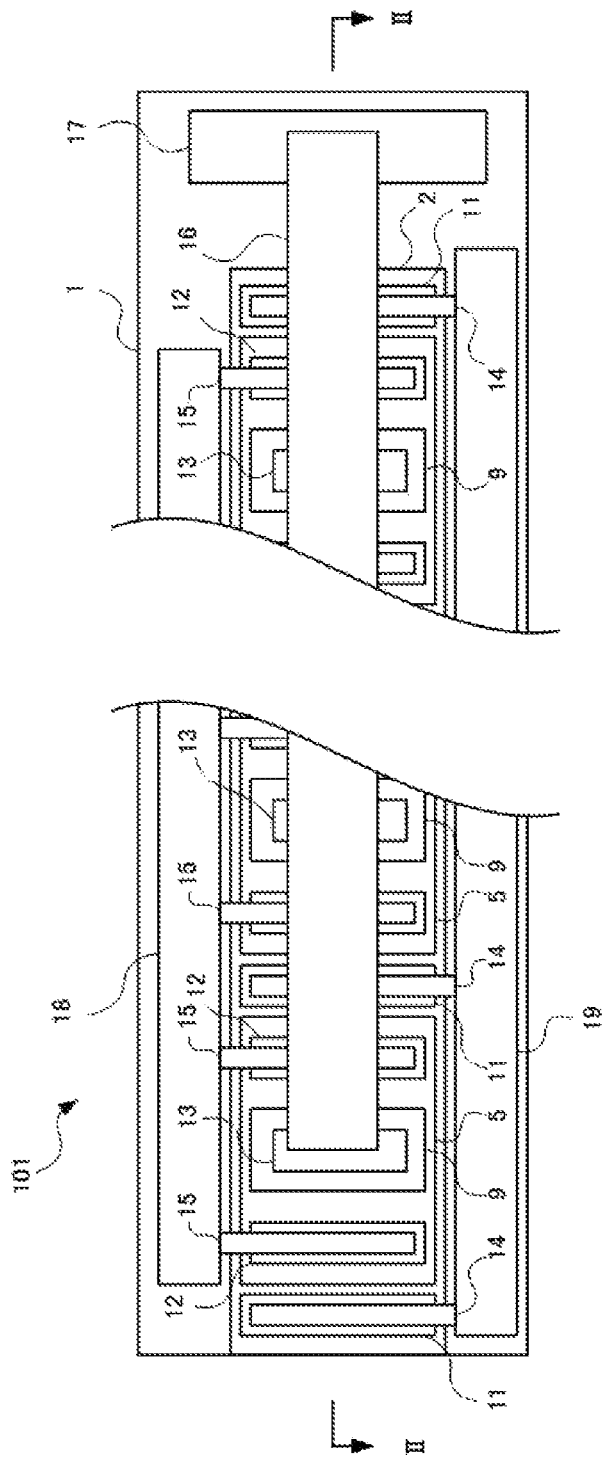
FIG. 12 is a plan view of an HBT according to a fifth preferred embodiment of the present invention.
Figure 13:
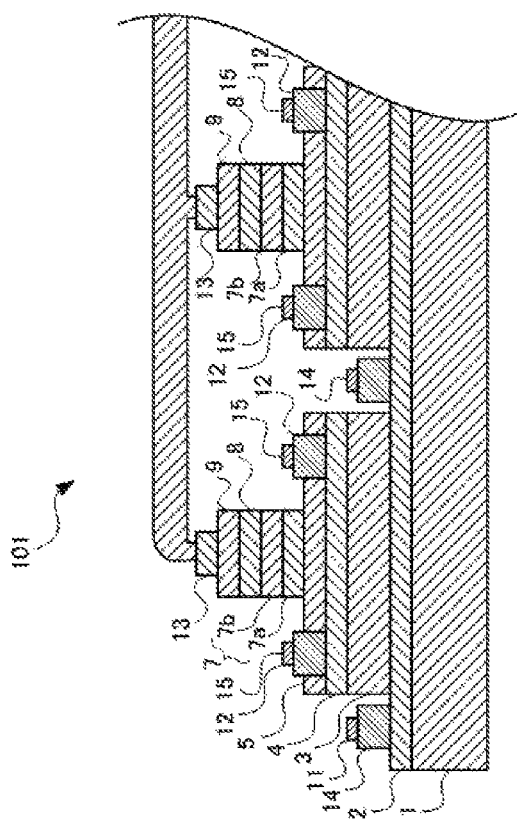
FIG. 13 is a sectional view taken along the line XII-XII of FIG. 12.
Figure 13:
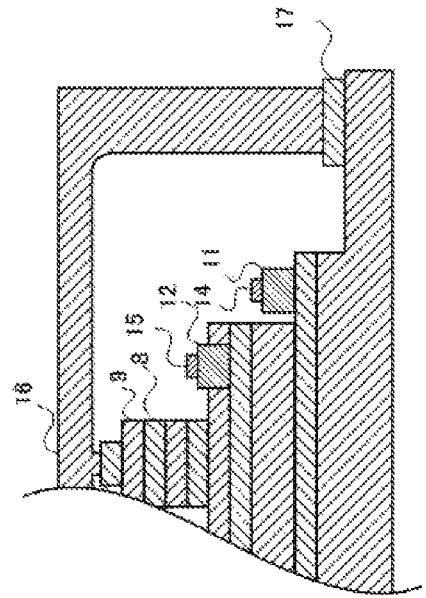

FIG. 12 is a plan view of an HBT 101 according to the fifth preferred embodiment. FIG. 13 is a sectional view taken along the line XII-XII of FIG. 12.

The HBT 101 includes the unit HBTs connected in parallel and therefore can use a large amount of electricity in addition to the effect described in the first preferred embodiment. Likewise, the HBTs 100 according to the second to fourth preferred embodiments can use a large amount of electricity in such a way that unit HBTs are connected in parallel.

Sixth Preferred Embodiment

A sixth preferred embodiment of the present invention will now be described. The sixth preferred embodiment provides a method for fabricating the HBT 101 according to the fifth preferred embodiment. The method is described below with reference to FIGS. 14A to 14C, 15A to 15C, and 16A to 16C.

Figure 14A:
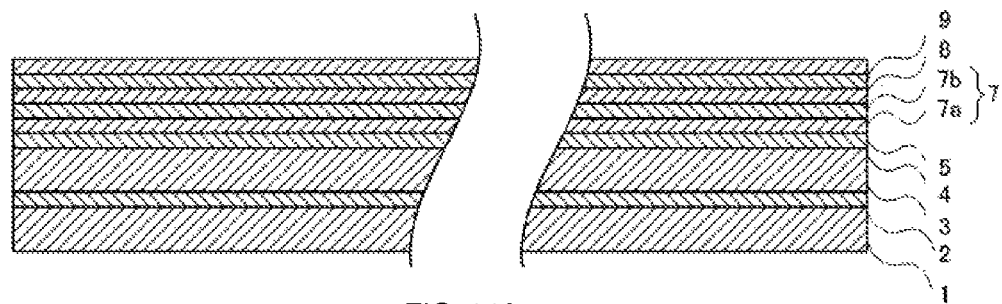
FIGS. 14A to 14C are illustrations showing steps of fabricating an HBT according to a sixth preferred embodiment of the present invention.

As illustrated in FIG. 14A, the following layers are deposited on a semi-insulating GaAs substrate 1 by metal-organic vapor phase epitaxy in this order: an n-type GaAs sub-collector layer 2 having a Si concentration of about $5 \times 10^{18}$ cm$^{-3}$ and a film thickness of about 0.6 μm; an n-type GaAs collector layer 3 having a Si concentration of about $5 \times 10^{16}$ cm$^{-3}$ and a film thickness of about 1.0 μm; a p-type GaAs base layer 4 having a C concentration of about $4 \times 10^{19}$ cm$^{-3}$ and a film thickness of about 150 nm; an n-type InGaP emitter layer 5 having an In-to-P molar ratio of 0.5, a Si concentration of about $3 \times 10^{17}$ cm$^{-3}$, and a film thickness of about 30 nm; an n-type AlGaAs emitter ballast resistor sub-layer 7a having an Al-to-As molar ratio of about 0.33, a Si concentration of about $5.4\times10^{16}$ cm$^{-3}$, and a film thickness of about 37 nm; an n-type AlGaAs emitter ballast resistor sub-layer 7b having an Al-to-As molar ratio of about 0.33, a Si concentration of about $5.0\times10^{17}$ cm$^{-3}$, and a film thickness of about 122 nm; an n-type GaAs contact layer 8 having a Si concentration of about $1\times10^{19}$ cm$^{-3}$ and a film thickness of about 50 nm; and an n-type InGaAs contact layer 9 having an In-to-As molar ratio of about 0.5, a Si concentration of about $1\times10^{19}$ cm$^{-3}$, and a film thickness of about 50 nm.

Figure 14B:
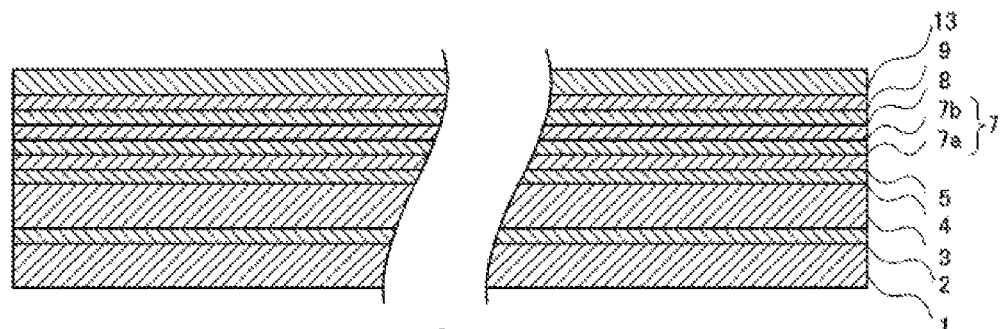

As illustrated in FIG. 14B, a W—Si layer 130 is deposited over the n-type InGaAs contact layer 9 by a radio-frequency sputtering process so as to have a W-to-Si molar ratio of 0.3 and a film thickness of about 0.3 μm.

Figure 14C:
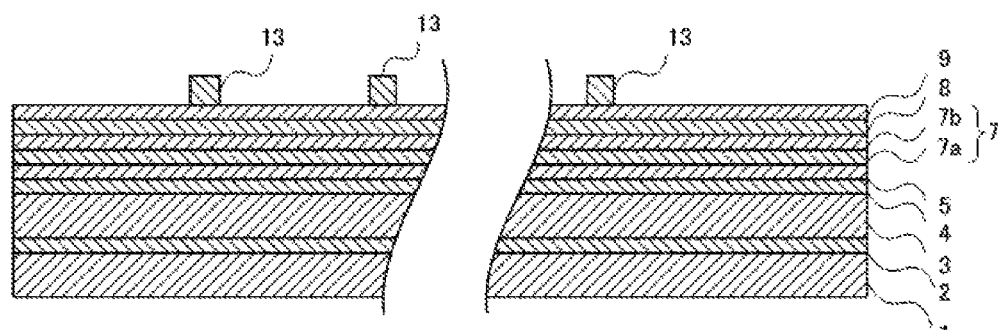

As illustrated in FIG. 14C, the W—Si layer 130 is processed into emitter electrodes 13 by photolithography and dry etching using CF$_4$.

Figure 15A:
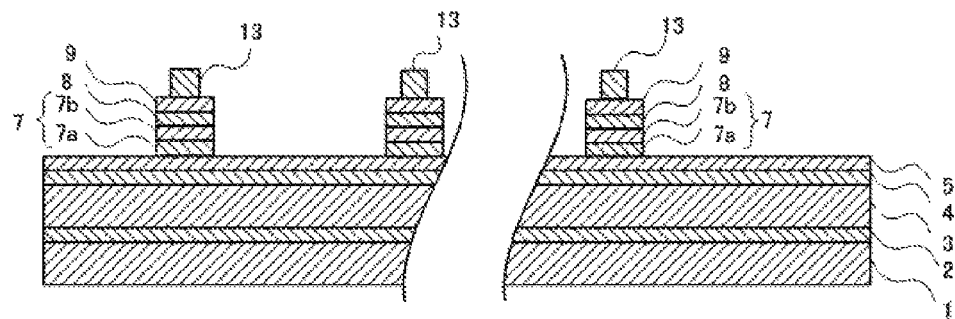
FIGS. 15A to 15C are illustrations showing steps of fabricating the HBT according to the sixth preferred embodiment of the present invention.

As illustrated in FIG. 15A, the n-type InGaAs contact layer 9, the n-type GaAs contact layer 8, the n-type AlGaAs emitter ballast resistor sub-layer 7b, and the n-type AlGaAs emitter ballast resistor sub-layer 7a are processed so as to have a desired shape, such that emitter regions are formed.

An example of a process for forming the emitter regions is as described below. Unnecessary regions are removed from the n-type InGaAs contact layer 9, the n-type GaAs contact layer 8, the n-type AlGaAs emitter ballast resistor sub-layer 7b, and the n-type AlGaAs emitter ballast resistor sub-layer 7a by photolithography and wet etching using an etchant having a phosphoric acid-to-aqueous hydrogen peroxide-to-water ratio of, for example, 1:2:40.

Figure 15B:
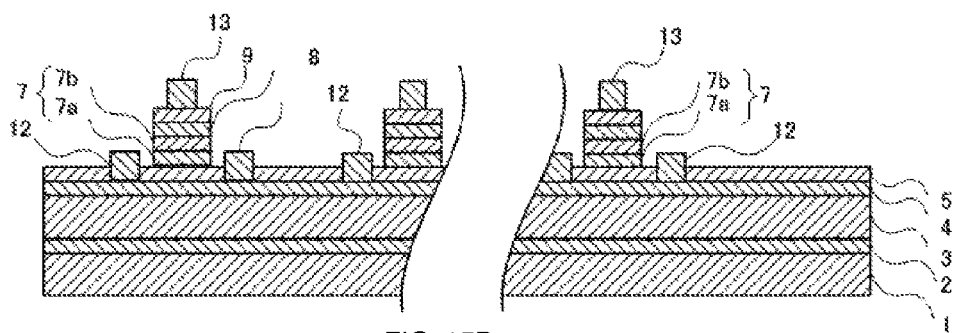

As illustrated in FIG. 15B, base electrodes 12 are formed by vapor deposition and a lift-off process so as to extend through extend through the n-type InGaP emitter layer 5 to the p-type GaAs base layer 4. The base electrodes 12 each include a Ti layer with a film thickness of about 50 nm, a Pt layer with a film thickness of about 50 nm, and an Au layer with a film thickness of about 200 nm.

Figure 15C:
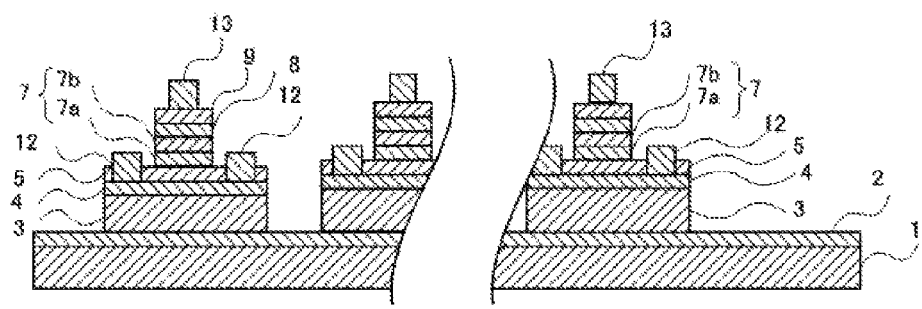

As illustrated in FIG. 15C, the n-type GaAs sub-collector layer 2 is partly exposed in such a way that unnecessary regions are removed from the n-type InGaP emitter layer 5, the p-type GaAs base layer 4, and the n-type GaAs collector layer 3 by photolithography and wet etching, such that base regions are formed.

Etchants used are as described below. An etchant used to etch the n-type InGaP emitter layer 5 is hydrochloric acid. An etchant used to etch the p-type GaAs base layer 4 and the n-type GaAs collector layer 3 has a phosphoric acid-to-aqueous hydrogen peroxide-to-water ratio of, for example, 1:2:40.

Figure 16A:
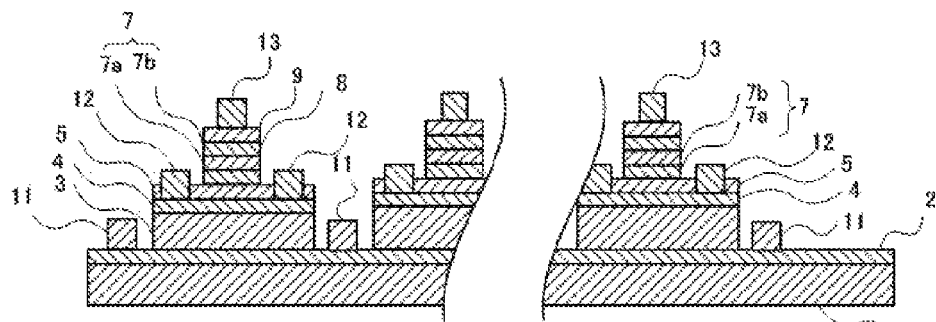
FIGS. 16A to 16C are illustrations showing steps of fabricating the HBT according to the sixth preferred embodiment of the present invention.

As illustrated in FIG. 16A, collector electrodes 11 are formed by vapor deposition and a lift-off process and are alloyed at about 350° C. for 30 minutes. The collector electrodes 11 are laminates each including an Au—Ge layer with a film thickness of about 60 nm, a Ni layer with a film thickness of about 10 nm, and an Au layer with a film thickness of about 200 nm.

Figure 16B:
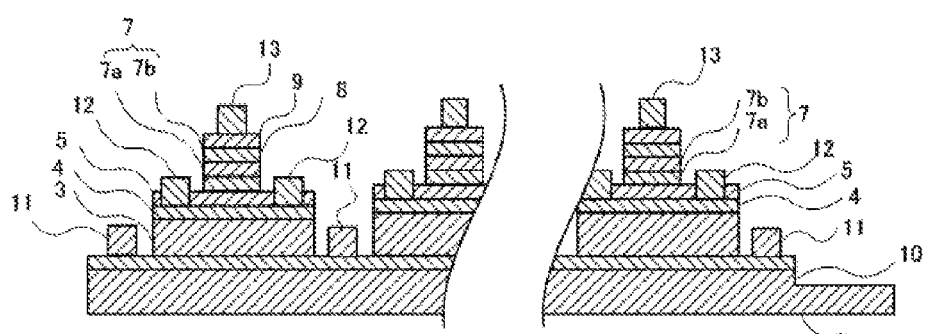

As illustrated in FIG. 16B, an isolation groove 10 is formed by wet etching. An etchant used to form the isolation groove 10 has a phosphoric acid-to-aqueous hydrogen peroxide-to-water ratio of, for example, 1:2:40.

Figure 16C:
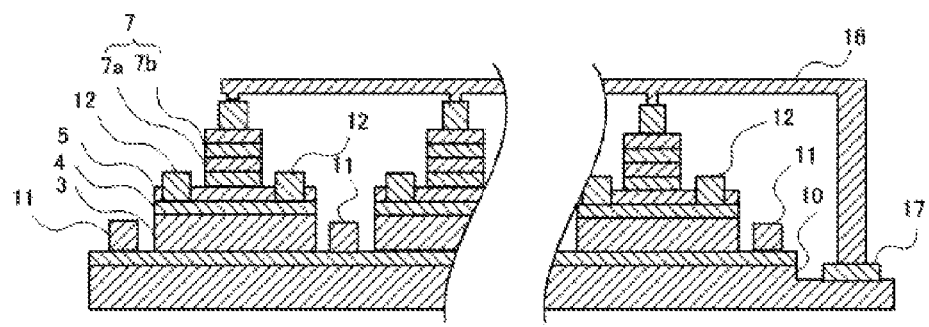

As illustrated in FIG. 16C, wiring lines connecting the emitter electrode 13, the base electrodes 12, and the collector electrodes 11, which are arranged between the unit HBTs, are formed.

Through steps illustrated in FIGS. 14A to 16C, the HBT 101 can be fabricated. The HBT 101 fabricated as described above provides substantially the same effect as that of the HBT 101 according to the fifth preferred embodiment. In the sixth preferred embodiment, the method for fabricating the HBT 101 is described. The HBTs 100 according to the first to fourth preferred embodiments can be fabricated by a combination of a technique described in the sixth preferred embodiment and a known technique.

Seventh Preferred Embodiment

A seventh preferred embodiment of the present invention will now be described. The seventh preferred embodiment provides a power amplifier 200 including the HBT 100 according to the first preferred embodiment.

Figure 17:
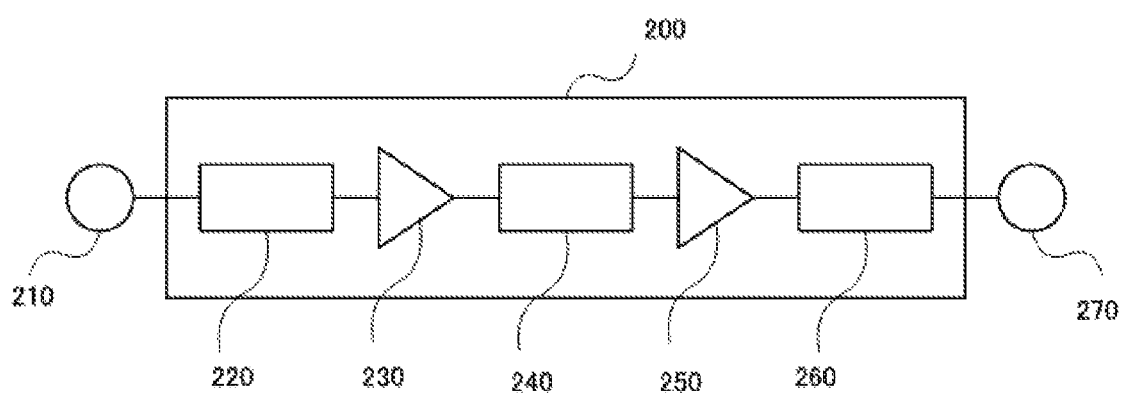
FIG. 17 is a block diagram of a power amplifier according to a seventh preferred embodiment of the present invention.

FIG. 17 is a block diagram of the power amplifier 200. As illustrated in FIG. 17, the power amplifier 200 includes a radio-frequency wave input terminal 210 which is an input terminal for radio-frequency waves, an input-matching circuit 220 matching an input from the radio-frequency wave input terminal 210, a first amplifying circuit 230 amplifying an output from the input-matching circuit 220, an inter-stage matching circuit 240 matching an output from the first amplifying circuit 230, a second amplifying circuit 250 amplifying an output from the inter-stage matching circuit 240, an output-matching circuit 260 matching an output from the second amplifying circuit 250, and a radio-frequency wave output terminal 270 that outputs an output from the input-matching circuit 260 in the form of a radio-frequency wave.

Figure 18:
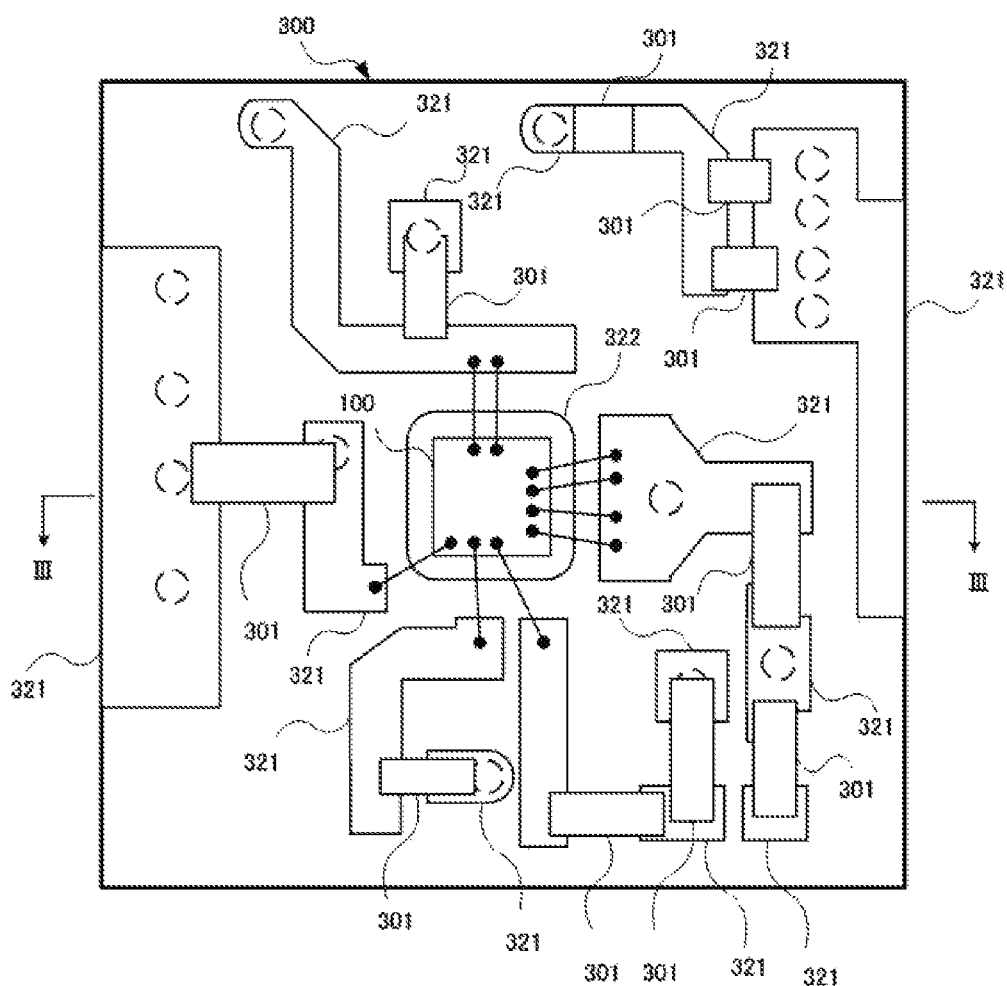
FIG. 18 is a plan view illustrating the installation state of a power amplifier module used in the seventh preferred embodiment of the present invention.
Figure 19:
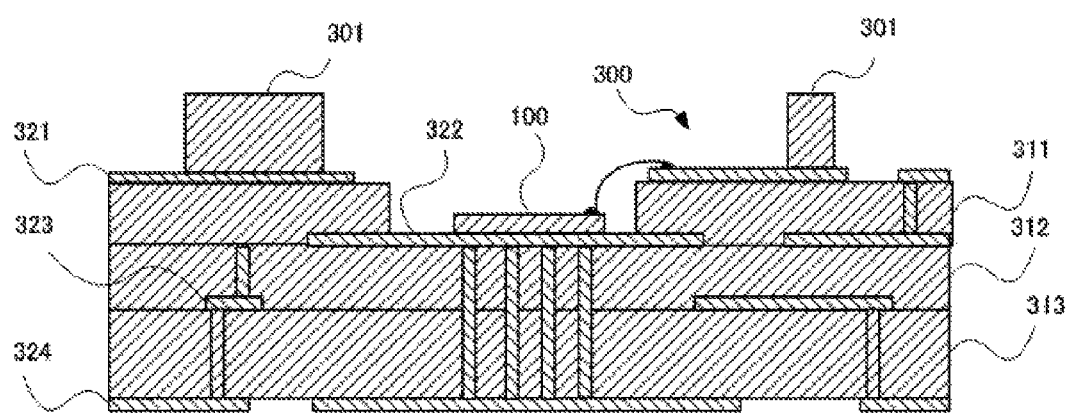
FIG. 19 is a sectional view taken along the line XVIII-XVIII of FIG. 18.
Figure 20:
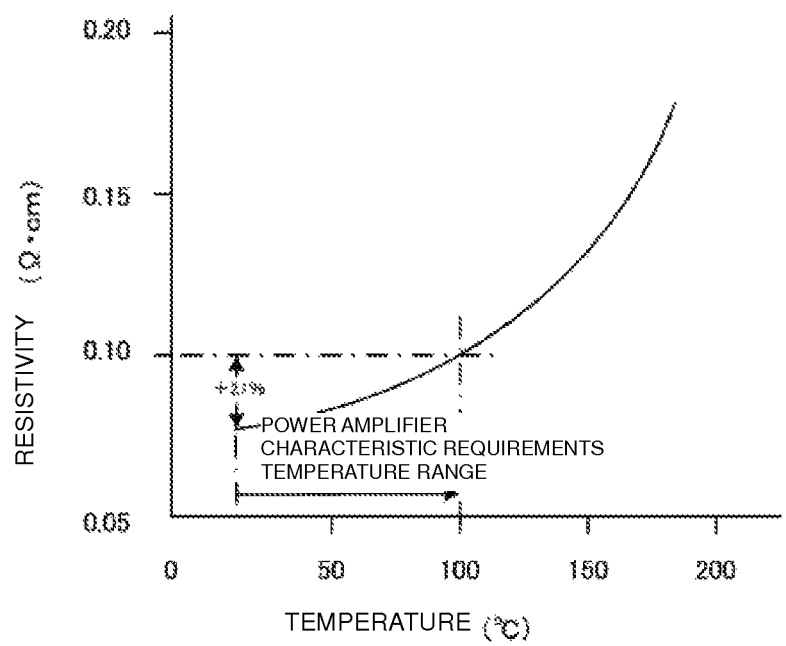
FIG. 20 is a graph illustrating the temperature dependence of resistivity of a known emitter ballast resistor layer.

FIG. 18 is a plan view illustrating the installation state of a power amplifier module 300 of the power amplifier 200. FIG. 19 is a sectional view taken along the line XVIII-XVIII of FIG. 18.

As illustrated in FIG. 19, the power amplifier module 300 includes three mounting boards 311 to 313 and conductive layers 321 to 324 alternately stacked and the HBT 100 is placed on the conductive layer 322. As illustrated in FIG. 18, the HBT 100, which is located on the conductive layer 322 of the power amplifier module 300, is connected to the surrounding conductive layers 321 through wiring lines. A plurality of passive elements 301 are arranged so as to connect the predetermined conductive layers 321.

The power amplifier 200 according to the seventh preferred embodiment includes the HBT 100 and therefore prevents both thermal runaway and the deterioration of power amplifier characteristics at elevated temperatures.

In the seventh preferred embodiment, the case where the HBT 100 according to the first preferred embodiment is installed in the power amplifier 200 is described. The seventh preferred embodiment is not limited to this case. The HBTs 100 according to the second and third preferred embodiments and the HBT 101 according to the fourth preferred embodiment can be similarly installed in the power amplifier 200.

The first to seventh preferred embodiments are intended to facilitate the understanding of the present invention and should not be construed as limitative. The present invention can be modified or improved without departing from the scope of the present invention. The present invention encompasses equivalents thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A heterojunction bipolar transistor comprising:
a ballast resistor layer having a resistance that increases with an increase in temperature; wherein
the ballast resistor layer includes a first ballast resistor sub-layer having a positive temperature coefficient of resistivity in a first temperature range and a second temperature range and a second ballast resistor sub-layer having a negative temperature coefficient of resistivity in the first temperature range and a positive temperature coefficient of resistivity in the second temperature range.

2. The heterojunction bipolar transistor according to claim 1, wherein the first ballast resistor sub-layer is located above an emitter layer.

3. The heterojunction bipolar transistor according to claim 1, wherein the ballast resistor layer further includes a third ballast resistor sub-layer having a negative temperature coefficient of resistivity in the first temperature range and a positive temperature coefficient of resistivity in the second temperature range and the first ballast resistor sub-layer is located between the second and third ballast resistor sub-layers.

4. The heterojunction bipolar transistor according to claim 1, further comprising:
   an emitter layer; and
   an GaAs layer located between the emitter layer and the ballast resistor layer.

5. The heterojunction bipolar transistor according to claim 4, wherein the emitter layer is made of InGaP.

6. The heterojunction bipolar transistor according to claim 4, wherein each of the first, second and third ballast resistor sub-layers is made of AlGaAs.

7. The heterojunction bipolar transistor according to claim 4, wherein the first, second and third ballast resistor sub-layers have different thicknesses.

8. The heterojunction bipolar transistor according to claim 4, wherein at least two of the first, second and third ballast resistor sub-layers have different concentrations of Si.

9. The heterojunction bipolar transistor according to claim 1, wherein the heterojunction bipolar transistor is provided in a plurality, and the plurality of heterojunction bipolar transistors are connected in parallel.

10. The heterojunction bipolar transistor according to claim 1, wherein at least one of the first and second ballast resistor sub-layers is made of AlGaAs.

11. The heterojunction bipolar transistor according to claim 1, wherein the first and second ballast resistor sub-layers have different thicknesses.

12. The heterojunction bipolar transistor according to claim 1, wherein the first and second ballast resistor sub-layers have different concentrations of Si.

13. A power amplifier comprising the heterojunction bipolar transistor according to claim 1.

14. The power amplifier according to claim 13, further comprising a mounting board and a conductive layer mounted thereon, wherein the heterojunction bipolar transistor is located on the conductive layer.

15. A method for fabricating a heterojunction bipolar transistor including a ballast resistor layer having a resistance that increases with an increase in temperature, the method comprising:
   a step of forming the ballast resistor layer; wherein
   the step of forming the ballast resistor layer includes a sub-step of forming a first ballast resistor sub-layer having a positive temperature coefficient of resistivity in a first temperature range and a second temperature range and a sub-step of forming a second ballast resistor sub-layer having a negative temperature coefficient of resistivity in the first temperature range and a positive temperature coefficient of resistivity in the second temperature range.

\* \* \* \* \*